US008988865B2

(12) United States Patent
Matsumoto et al.

(10) Patent No.: US 8,988,865 B2
(45) Date of Patent: Mar. 24, 2015

(54) ELECTRONIC APPARATUS

(71) Applicants: Yasuo Matsumoto, Ome (JP); Koichiro Takeguchi, Hachioji (JP); Shingo Koide, Tachikawa (JP)

(72) Inventors: Yasuo Matsumoto, Ome (JP); Koichiro Takeguchi, Hachioji (JP); Shingo Koide, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 13/708,261

(22) Filed: Dec. 7, 2012

(65) Prior Publication Data

US 2013/0308261 A1 Nov. 21, 2013

(30) Foreign Application Priority Data

May 21, 2012 (JP) .................................. 2012-115947

(51) Int. Cl.
*G06F 1/16* (2006.01)
*H05K 5/02* (2006.01)

(52) U.S. Cl.
CPC ................ *G06F 1/16* (2013.01); *H05K 5/0217* (2013.01); *G06F 1/1616* (2013.01); *G06F 1/1626* (2013.01); *G06F 1/1662* (2013.01)
USPC .................................. 361/679.17; 361/679.08

(58) Field of Classification Search
CPC ....... G06F 3/02; G06F 1/1616; G06F 1/1656; G06F 1/1662
See application file for complete search history.

(56) References Cited

U.S. PATENT DOCUMENTS

| 3,890,480 | A | * | 6/1975 | Berling et al. ............. 200/302.2 |
|---|---|---|---|---|
| 5,227,956 | A | * | 7/1993 | Johnson et al. ............... 361/736 |
| 5,301,132 | A | * | 4/1994 | Akahane ................... 361/679.09 |
| 5,355,278 | A | * | 10/1994 | Hosoi et al. .............. 361/679.09 |
| 5,510,953 | A | * | 4/1996 | Merkel ..................... 361/679.08 |
| 5,587,878 | A | * | 12/1996 | Tsai et al. ................. 361/679.57 |
| 5,786,775 | A | * | 7/1998 | Chang ............................ 341/22 |
| 6,064,564 | A | * | 5/2000 | Song et al. ............... 361/679.09 |
| 6,101,089 | A | * | 8/2000 | Seto et al. ................ 361/679.47 |
| 6,542,355 | B1 | * | 4/2003 | Huang ...................... 361/679.08 |
| 6,595,786 | B2 | * | 7/2003 | Horiuchi et al. ................. 439/74 |
| 6,695,629 | B1 | * | 2/2004 | Mayer .............................. 439/92 |
| 6,697,047 | B2 | * | 2/2004 | Agata ........................... 345/161 |
| 6,970,347 | B2 | * | 11/2005 | Schlesener et al. ....... 361/679.08 |
| 7,102,878 | B2 | * | 9/2006 | Yu et al. .................. 361/679.09 |
| 7,136,279 | B2 | * | 11/2006 | Yu et al. .................. 361/679.08 |
| 7,364,442 | B2 | * | 4/2008 | Bang et al. ...................... 439/92 |
| 2002/0047832 | A1 | | 4/2002 | Horiuchi et al. |

(Continued)

FOREIGN PATENT DOCUMENTS

| JP | 03-017675 | 2/1991 |
|---|---|---|
| JP | 03-060718 | 6/1991 |

(Continued)

OTHER PUBLICATIONS

Japanese Patent Application No. 2012-115947, First Office Action, mailed Apr. 9, 2013, (with English Translation).

*Primary Examiner* — Adrian S Wilson
(74) *Attorney, Agent, or Firm* — Blakely, Sokoloff, Taylor & Zafman LLP

(57) ABSTRACT

According to one embodiment, an electronic apparatus includes a housing, an engagement portion, a module, and a member. The engagement portion is on an inner surface of the housing. The module is in the housing. The member is configured to slide substantially in parallel with the inner surface of the housing in order to engage the engagement portion and to support the module from a side opposite to the inner surface of the housing.

11 Claims, 12 Drawing Sheets

(56) References Cited

U.S. PATENT DOCUMENTS

| | | | |
|---|---|---|---|
| 2003/0030997 A1* | 2/2003 | Mizusaki | 361/758 |
| 2004/0034994 A1* | 2/2004 | Chang | 29/760 |
| 2005/0047066 A1 | 3/2005 | Schlesener et al. | |
| 2005/0110761 A1* | 5/2005 | Minaguchi et al. | 345/168 |
| 2006/0291150 A1* | 12/2006 | Lo et al. | 361/680 |
| 2007/0019373 A1* | 1/2007 | Yokote | 361/683 |
| 2008/0019085 A1* | 1/2008 | Nakajima | 361/680 |
| 2008/0259537 A1* | 10/2008 | Arisaka et al. | 361/680 |

FOREIGN PATENT DOCUMENTS

| | | |
|---|---|---|
| JP | H 0473231 | 6/1992 |
| JP | 07-141056 | 6/1995 |
| JP | 2002-149305 | 5/2002 |
| JP | 2009294809 | 12/2009 |

* cited by examiner

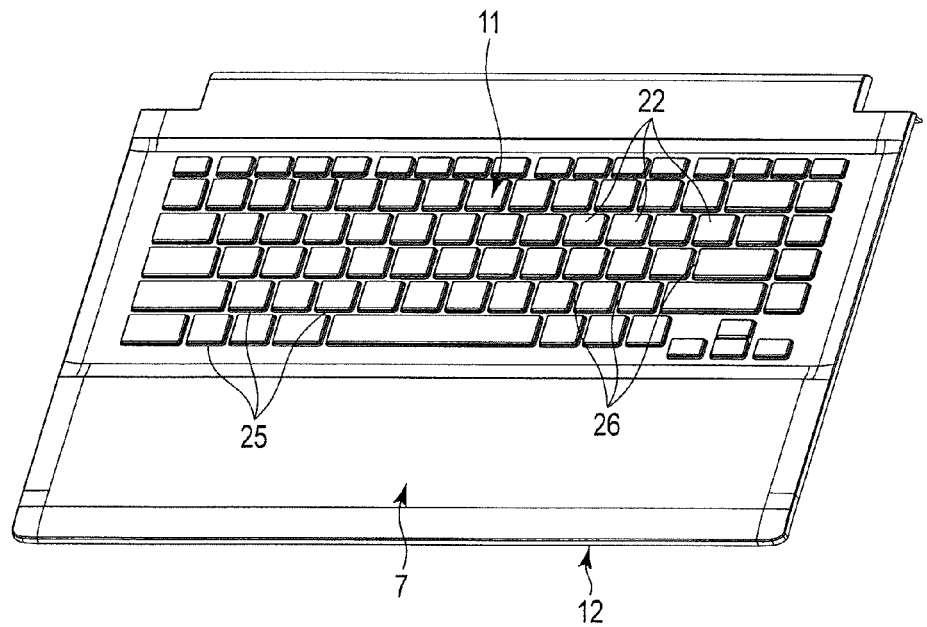
F I G. 2
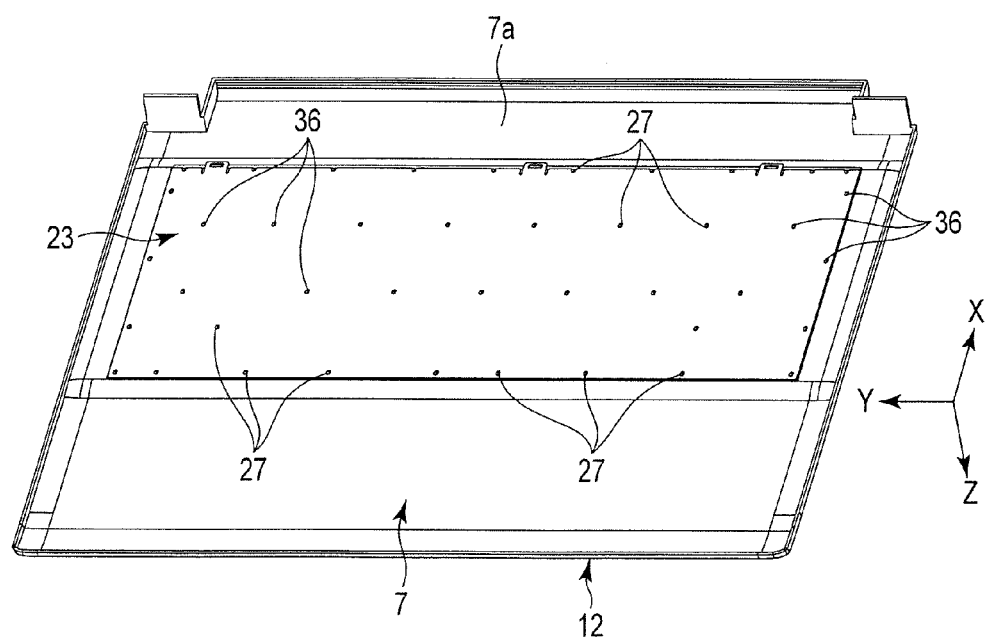
F I G. 3

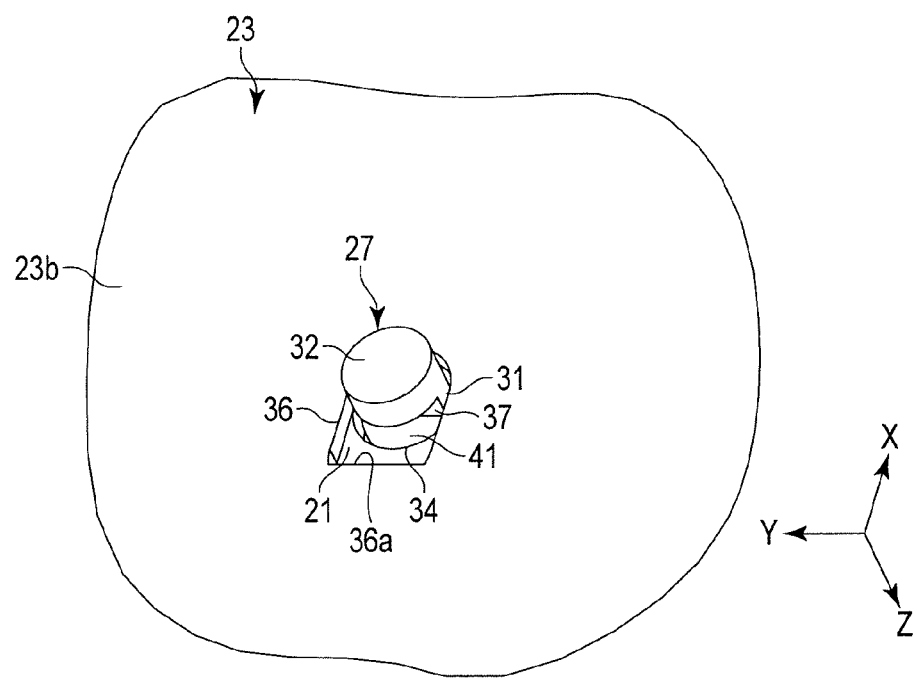
F I G. 6
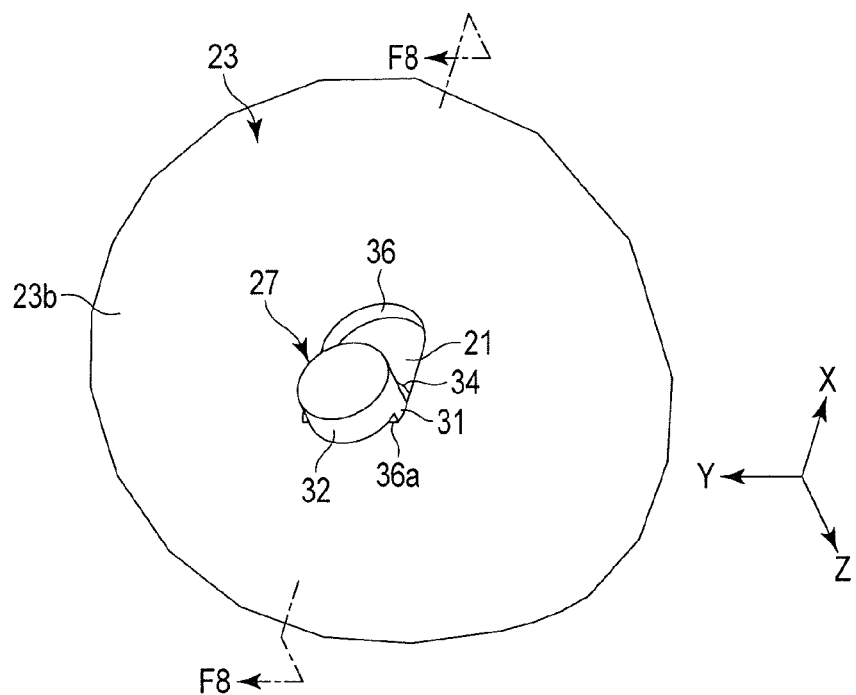
F I G. 7

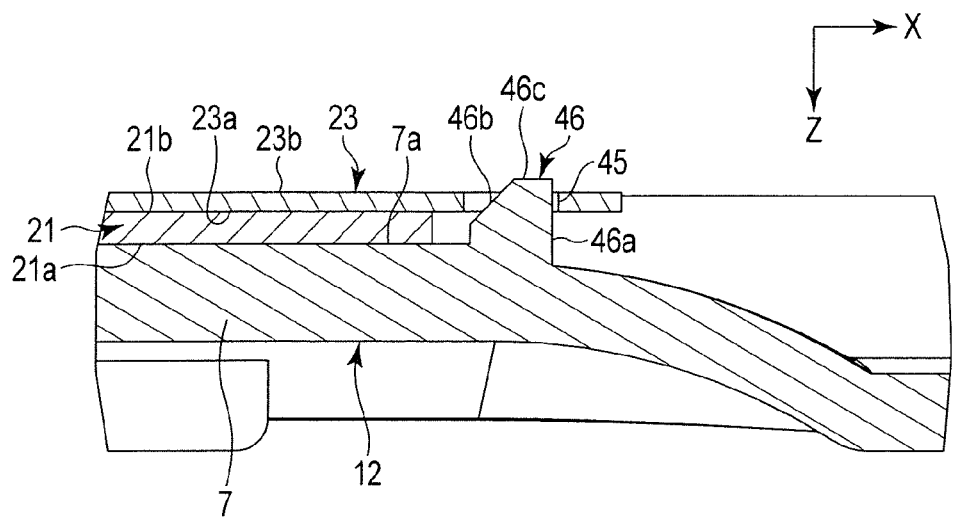
F I G. 10
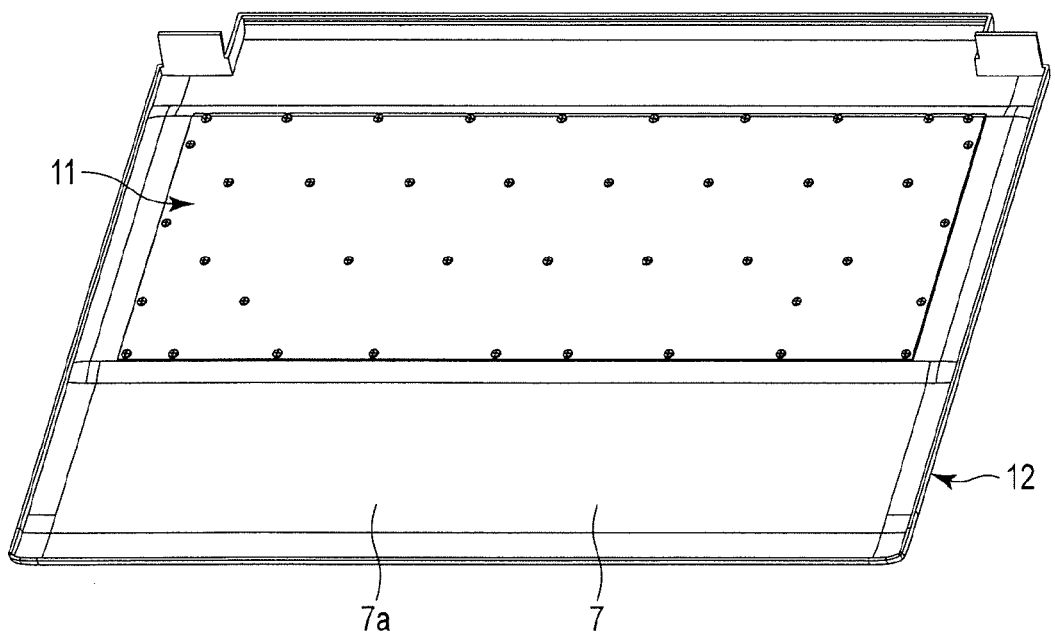
F I G. 11

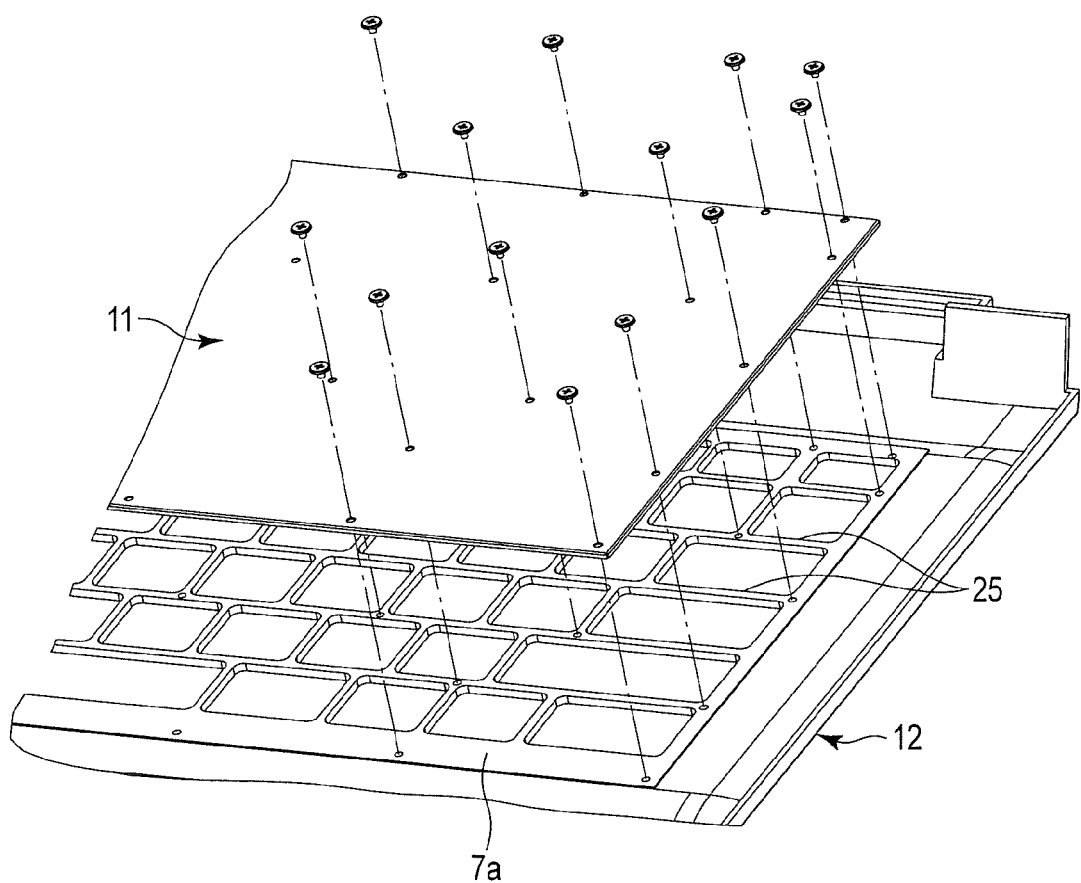
F I G. 12

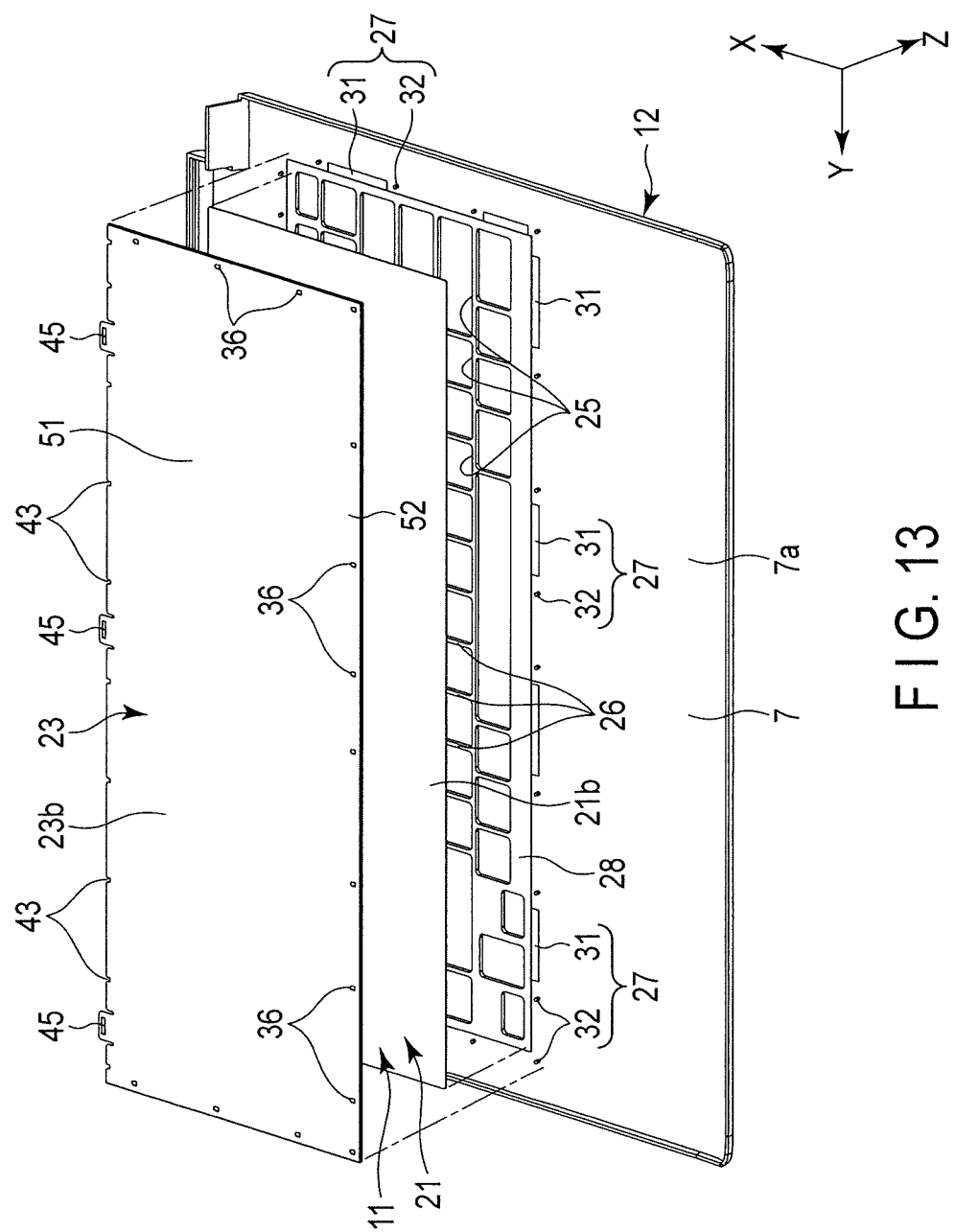
F I G. 13

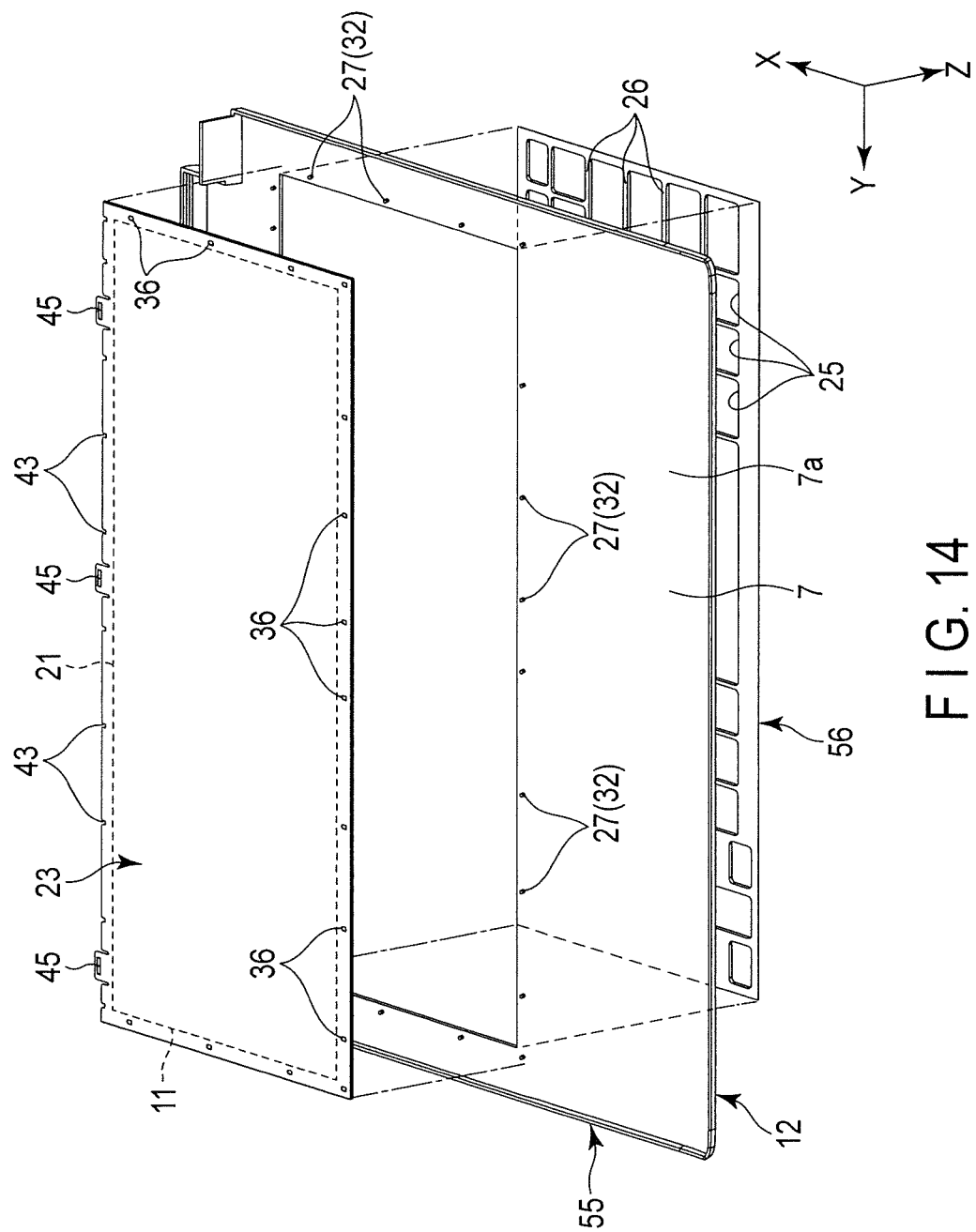
F I G. 14

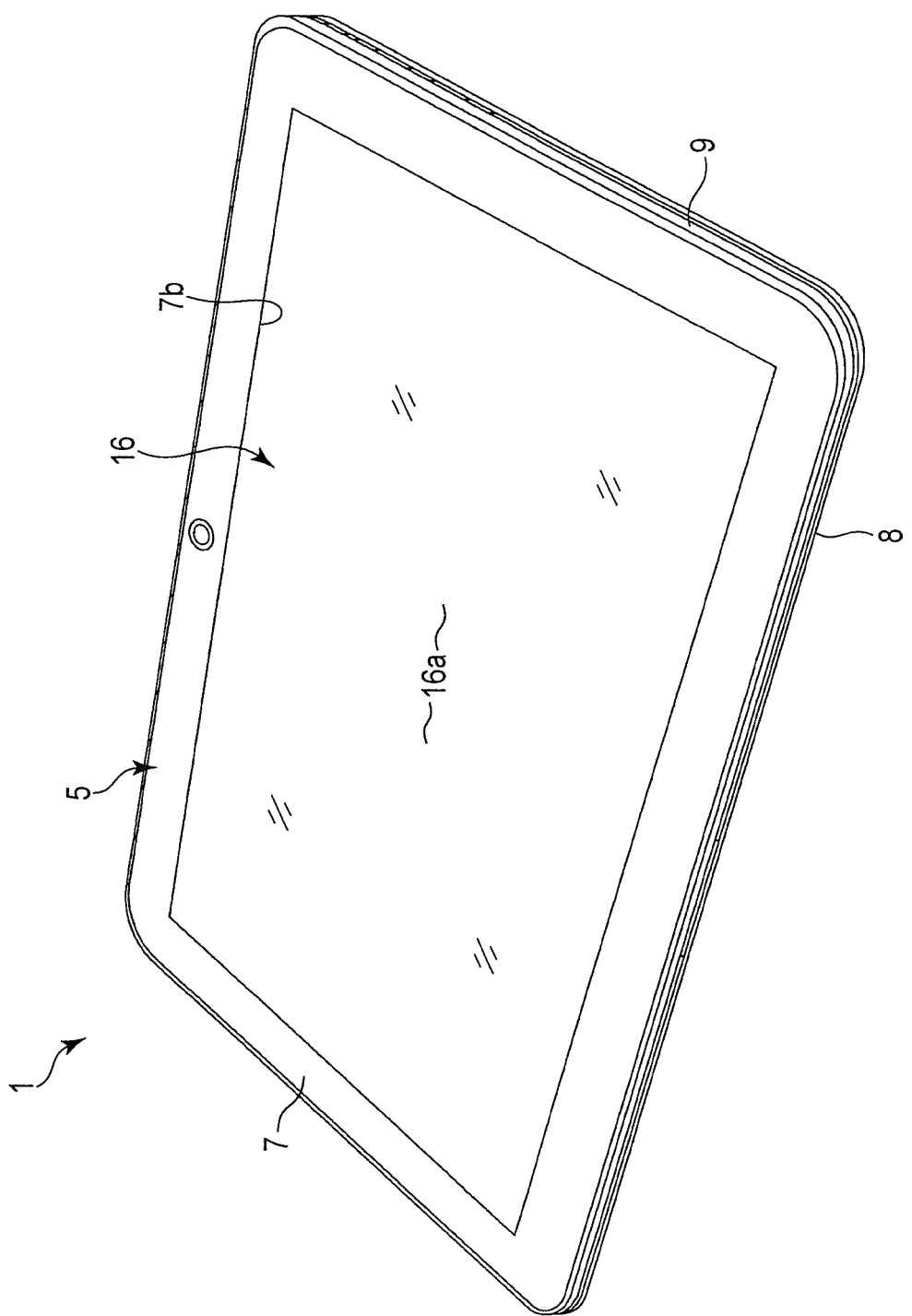
F I G. 15

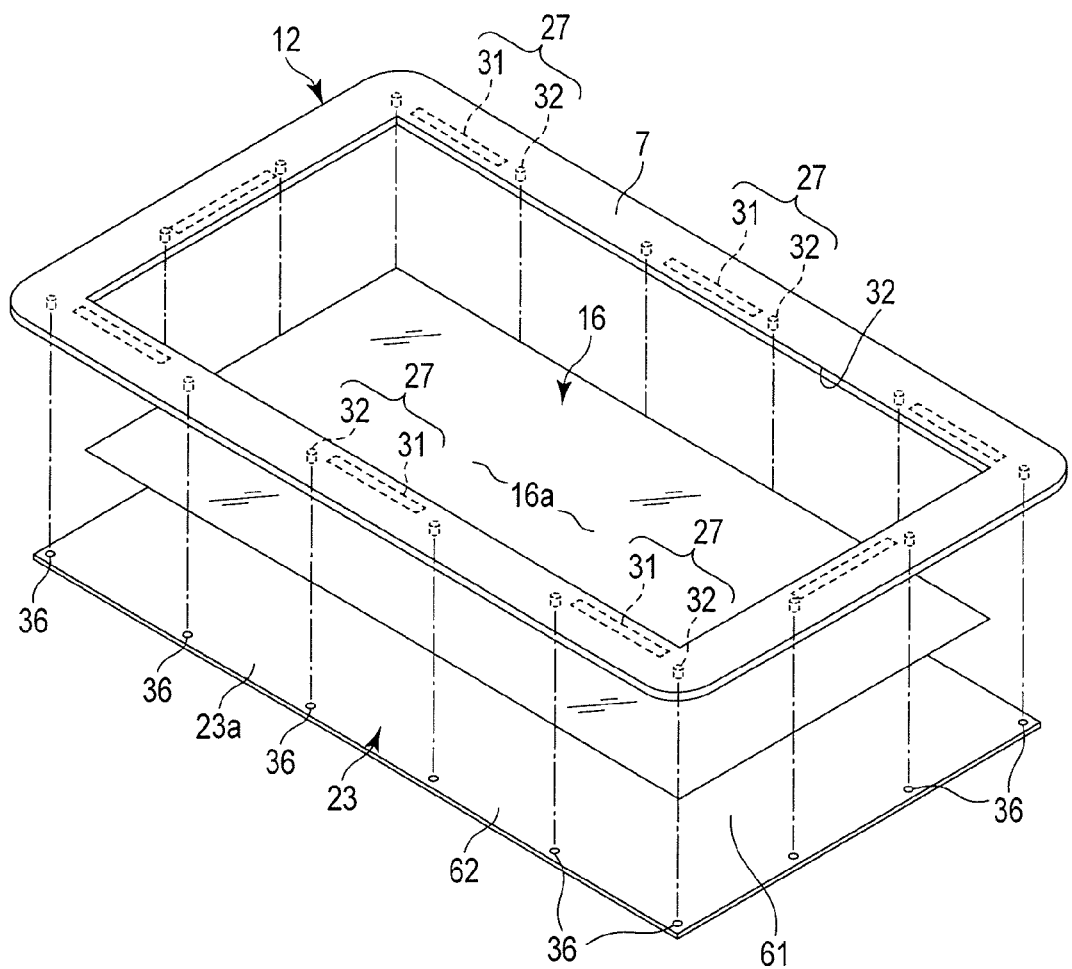
F I G. 16

ELECTRONIC APPARATUS

CROSS-REFERENCE TO RELATED APPLICATIONS

This application is based upon and claims the benefit of priority from Japanese Patent Application No. 2012-115947, filed May 21, 2012, the entire contents of which are incorporated herein by reference.

FIELD

Embodiments described herein relate generally to electronic apparatuses.

BACKGROUND

Electronic apparatuses with a keyboard have been provided.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 2 is an exemplary perspective view illustrating an upper surface of a cover illustrated in FIG. 1;

FIG. 3 is an exemplary perspective view illustrating an inner surface of the cover illustrated in FIG. 2;

FIG. 6 is an exemplary perspective view illustrating an engagement portion illustrated in FIG. 5 in an enlarged scale;

FIG. 7 is an exemplary perspective view illustrating the engagement portion illustrated in FIG. 5 in an enlarged scale;

FIG. 10 is an exemplary cross-sectional view taken along line F10-F10 of a supporter illustrated in FIG. 9;

FIG. 11 is an exemplary perspective view illustrating an inner surface of the cover of the electronic apparatus according to the first embodiment;

FIG. 12 is an exemplary perspective view illustrating a state where a keyboard is removed from the cover illustrated in FIG. 11;

FIG. 13 is an exemplary perspective view illustrating a support plate of an electronic apparatus according to a second embodiment;

FIG. 14 is an exemplary perspective view illustrating a support plate of an electronic apparatus according to a third embodiment;

FIG. 15 is an exemplary perspective view of an electronic apparatus according to a fourth embodiment; and FIG. 16 is an exemplary perspective view illustrating a support plate of the electronic apparatus illustrated in FIG. 15.

DETAILED DESCRIPTION

Various embodiments will be described hereinafter with reference to the accompanying drawings.

In general, according to one embodiment, an electronic apparatus comprises a housing, an engagement portion, a module, and a member. The engagement portion is on an inner surface of the housing. The module is in the housing. The member is configured to slide substantially in parallel with the inner surface of the housing in order to engage the engagement portion and to support the module from a side opposite to the inner surface.

Hereinafter, embodiments will be described with reference to the accompanying drawings. Herein, some components are expressed by two or more terms. Those terms are just examples. Those components may be further expressed by another or other terms. And the other components which are not expressed by two or more terms may be expressed by another or other terms.

First Embodiment

An electronic apparatus 1 according to a first embodiment will be described with reference to FIGS. 1 to 10. The electronic apparatus 1 according to the present embodiment is a notebook-type portable computer (a note PC), for example. The electronic apparatus to which all embodiments described herein is not limited to the above example. All embodiments described herein can be broadly applied to various electronic apparatuses such as, for example, a slate-type portable computer (a slate PC or a tablet), a television, a mobile phone (including a smart phone), or a game machine.

Figure 1:
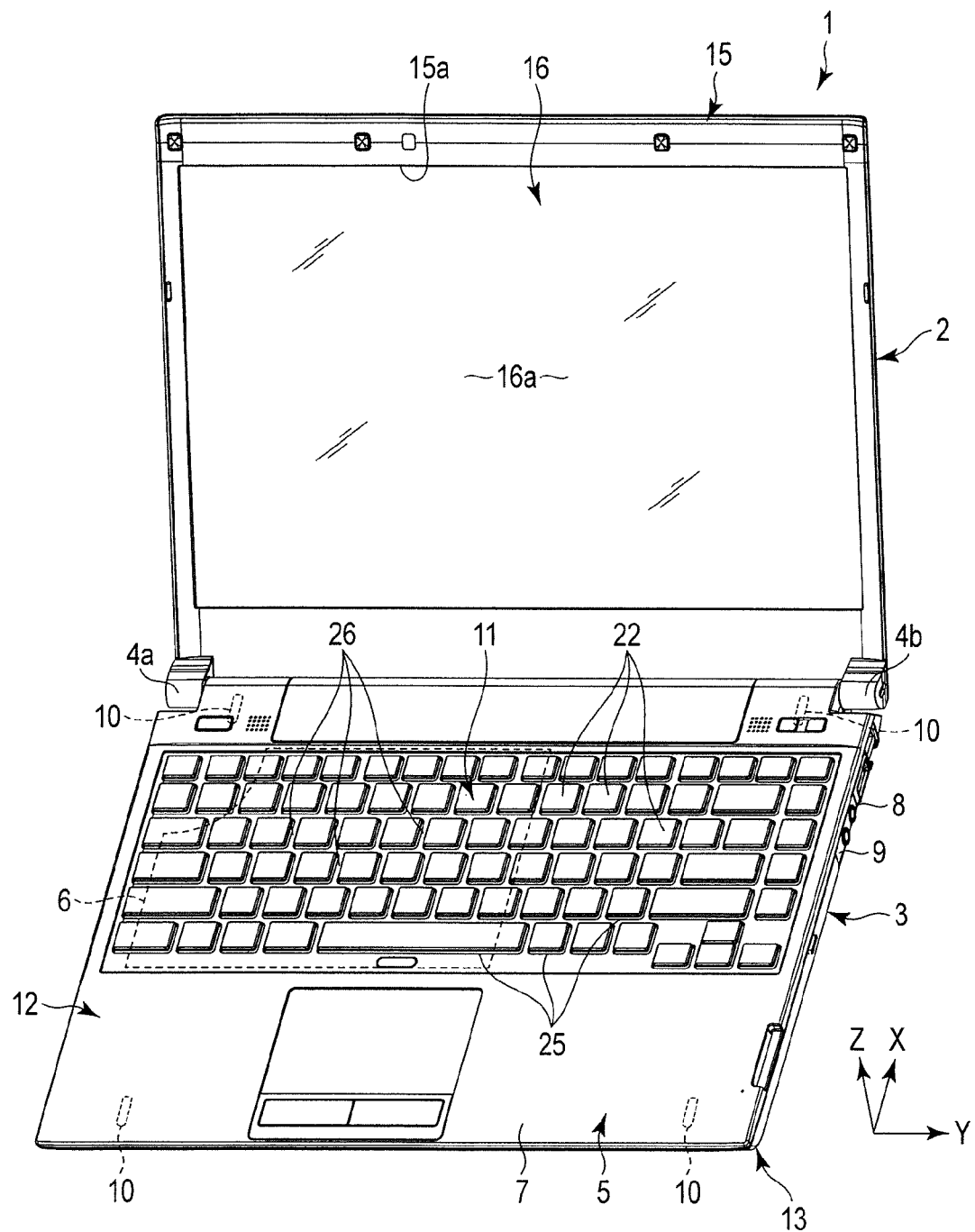
FIG. 1 is an exemplary perspective view of an electronic apparatus according to a first embodiment.

As illustrated in FIG. 1, the electronic apparatus 1 includes a first unit 2, a second unit 3, and hinges 4a and 4b. The first unit 2 is a main unit in which a main board, for example, is mounted. The first unit 2 includes a first housing 5. A circuit board 6 as a main board, for example, is accommodated in the first housing 5.

The first housing 5 includes an upper wall 7 (i.e., a first wall), a lower wall 8 (i.e., a bottom wall or a second wall), and a circumferential wall 9 (i.e., side walls or a third wall), and has a flat box-like shape. Herein, the directions up, down, left, and right are defined as seen from the user. Moreover, the side closer to the user is defined as "front," and the side further from the user is defined as "rear."

The lower wall 8 faces an upper surface (i.e., an outer mounting surface, a mounting surface, or an outer surface) of a table when the electronic apparatus 1 is placed on the table. A plurality of legs 10 (i.e., supporters) that makes contact with the upper surface of the table, for example, are provided on the lower wall 8. The upper wall 7 is positioned on a side opposite to the lower wall 8 and is configured to extend (i.e., expand) substantially in parallel with the lower wall 8.

A keyboard 11 is provided on the upper wall 7. The keyboard 11 is an example of an input portion (i.e., input receiving unit). The input portion provided to the first housing 5 is not limited to the keyboard and may be a touch panel (i.e., a touch sensor) or other input devices. The circumferential wall 9 extends in a direction crossing the upper wall 7 and the lower wall 8 and connects a peripheral portion of the lower wall 8 and a peripheral portion of the upper wall 7.

As illustrated in FIG. 1, the first housing 5 includes a first cover 12 (e.g., an upper cover) and a second cover 13 (e.g., a lower cover or a base). An example of the first cover 12 includes the upper wall 7. An example of the second cover 13 includes the lower wall 8 and the circumferential wall 9. The first cover 12 and the second cover 13 are combined to form the first housing 5.

As illustrated in FIG. 1, the second unit 3 is a display unit. The second unit 3 includes a second housing 15 and a display device 16 (i.e., a display portion, a display, or a display module) accommodated in the second housing 15. The display device 16 includes a display screen 16a. The display device 16 is a liquid crystal display (LCD) or an organic EL display, for example, but the display device 16 is not limited to these examples. A front wall of the second housing 15 has an opening 15a through which the display screen 16a is exposed.

As illustrated in FIG. 1, the hinges 4a and 4b are fixed to the first housing 5 and the second housing 15, respectively, and are configured to rotatably (i.e., openably) connect the first housing 5 and the second housing 15. In this way, the second housing 15 can be rotated between a first position where the first housing 5 and the second housing 15 overlap each other and a second position where the first housing 5 and the second housing 15 are away from each other. At the first position, the keyboard 11 and the display screen 16a are exposed to the outside. At the second position, the keyboard 11 and the display screen 16a are concealed from the outside.

Next, an attachment structure of the keyboard 11 in the present embodiment will be described. The keyboard 11 (or a keyboard base 21 described below) is an example of a "module." The attachment structure described herein is not limited to the keyboard and can be broadly applied to a display and other modules (i.e., units).

As illustrated in FIG. 1, the keyboard 11 according to the present embodiment is a tile keyboard. The keyboard 11 includes the keyboard base 21 (i.e., a base, see FIG. 4) and a plurality of keys 22 (i.e., key tops) provided on the keyboard base 21.

The keyboard base 21 is a sheet having substantially the same size as that of the outer shape of the keyboard 11. The keyboard base 21 includes a membrane (i.e., a membrane sheet). The membrane includes a plurality of contacts corresponding to the respective keys 22 and a wiring pattern that connects these contacts. Moreover, a flexible wiring board that is connected to the circuit board 6 is connected to the keyboard base 21.

The keyboard base 21 is accommodated in the first housing 5 (hereinafter referred to as a housing 5). The keyboard base 21 includes a first surface 21a and a second surface 21b. The first surface 21a faces the inner surface 7a of the upper wall 7. The second surface 21b is positioned on a side opposite to the first surface 21a and faces the inside of the housing 5. The second surface 21b faces a support plate 23 described below. The keys 22 are mounted on the first surface 21a of the keyboard base 21.

In general, a keyboard unit has a configuration in which a keyboard base, a plurality of keys, and a metal plate that covers the lower surface of the keyboard base are integrated. On the other hand, in the keyboard 11 according to the present embodiment, the metal plate is separated as the support plate 23 described below. Thus, the keyboard 11 according to the present embodiment is not provided with the metal plate and has bendability (i.e., flexibility). Moreover, since the metal plate is separated as the support plate 23, the keyboard 11 according to the present embodiment can be made thinner than general keyboards.

FIGS. 2 and 3 illustrate the first cover 12. The first cover 12 is a one-piece component, for example, and is configured as a single connected part. The upper wall 7 includes a plurality of first openings 25 and a plurality of closed portions 26 (e.g., beams) that are formed between the first openings 25. The closed portions 26 face the first surface 21a of the keyboard base 21. The closed portions 26 are formed in a grid form, for example.

The respective keys 22 of the keyboard 11 are exposed to the outside through the respective first openings 25. Specifically, as described above, the keyboard base 21 is accommodated in the housing 5. The respective keys 22 protrude from the inner side of the housing 5 and pass through the first openings 25 to be exposed to the outside through the first openings 25. On the other hand, a larger part of the keyboard base 21 is concealed from the outside by the closed portions 26 of the upper wall 7. In this way, the electronic apparatus 1 having a slim appearance is provided.

Here, the housing 5 includes a first inner surface 7a and a second inner surface. The first inner surface 7a is the inner surface of the upper wall 7. The second inner surface is the inner surface of the lower wall 8. The expression "inner surface" used herein denotes the first inner surface 7a. The first inner surface 7a is the inner surface of a wall in which openings are formed so that a module is exposed to the outside through the openings, for example. In the present embodiment, the first inner surface 7a is the inner surface of the wall 7 in which the openings 25 are formed so that the keyboard 11 is exposed to the outside through the openings 25.

Figure 4:
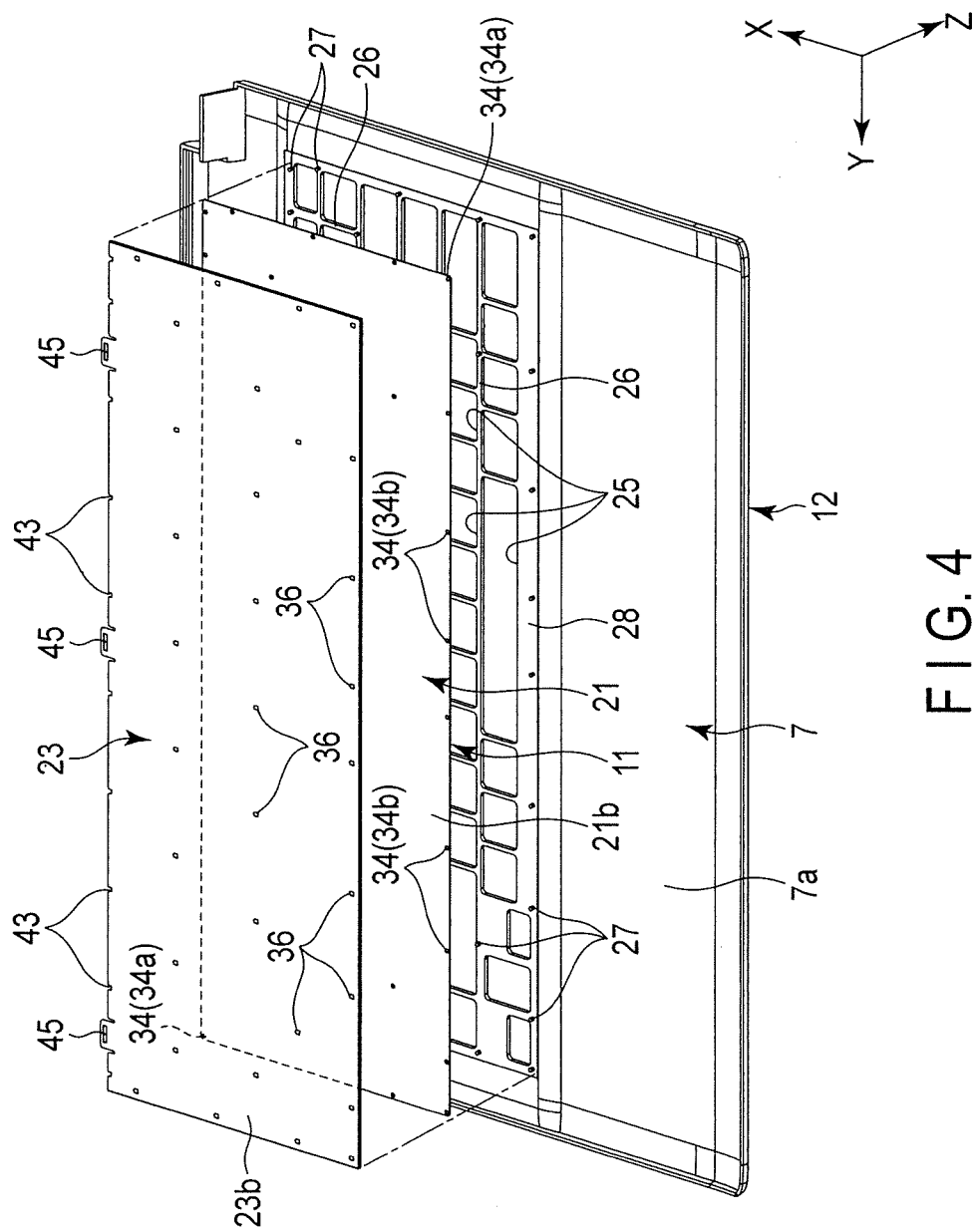
FIG. 4 is an exemplary perspective view illustrating a state where a support plate and a keyboard are removed from the cover illustrated in FIG. 3.
Figure 5:
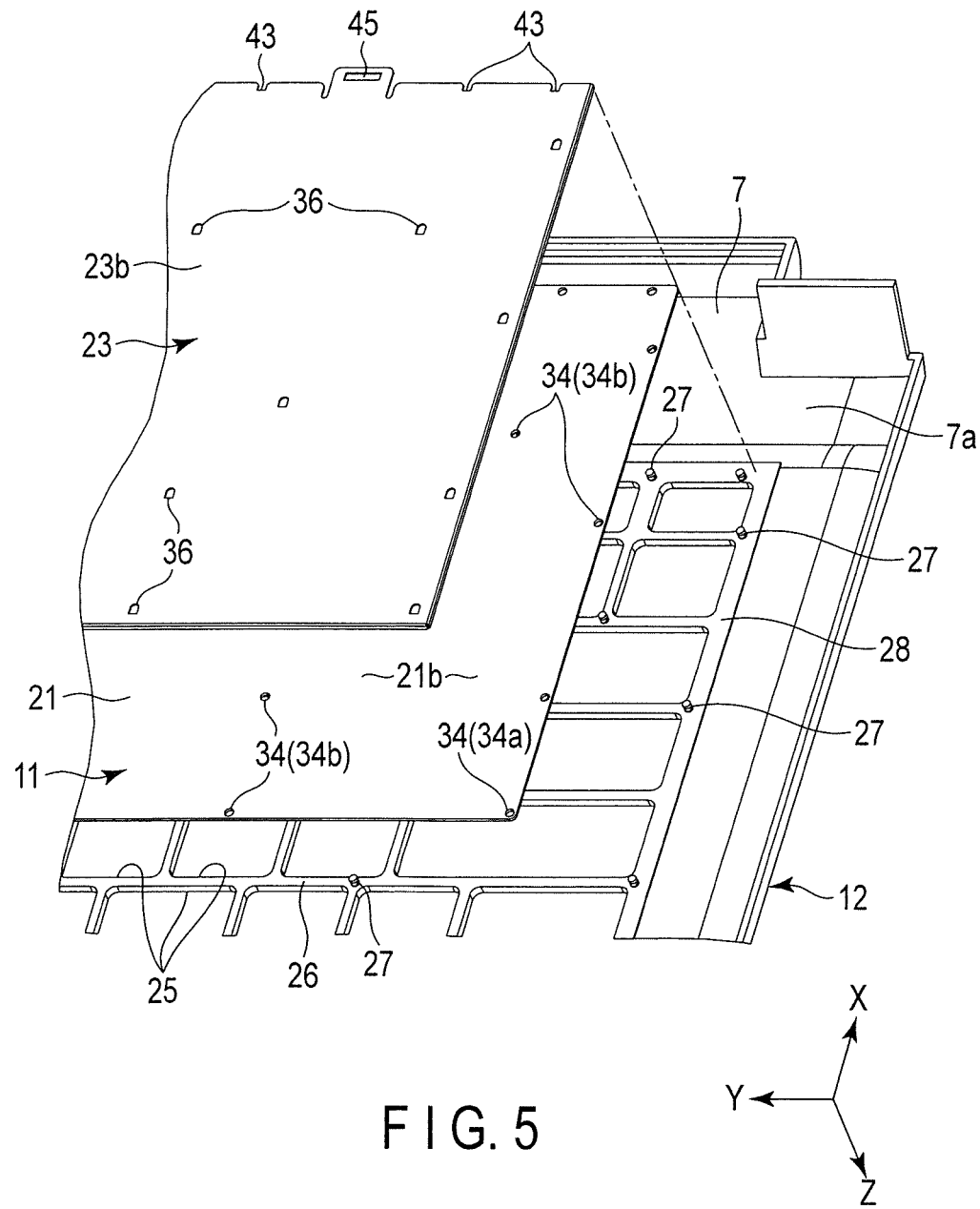
FIG. 5 is an exemplary perspective view illustrating part of components illustrated in FIG. 4 in an enlarged scale.

As illustrated in FIGS. 4 and 5, a plurality of engagement portions 27 is provided on the inner surface 7a of the housing 5. The engagement portions 27 are projections that project from the inner surface 7a of the housing 5 toward the inner side of the housing 5. The inner surface 7a of the housing 5 includes a keyboard attachment region 28. The keyboard attachment region 28 is a region that faces the keyboard base 21. The respective engagement portions 27 are positioned to be separated substantially over the entire area of the keyboard attachment region 28.

At least one engagement portion 27 is positioned between the respective first openings 25 and is provided on the closed portion 26. In the present embodiment, several engagement portions 27 are provided on the closed portion 26. Further, the other several engagement portions 27 are provided on a peripheral portion (i.e., an end portion, a peripheral edge, or an edge) of the keyboard attachment region 28.

Figure 8:
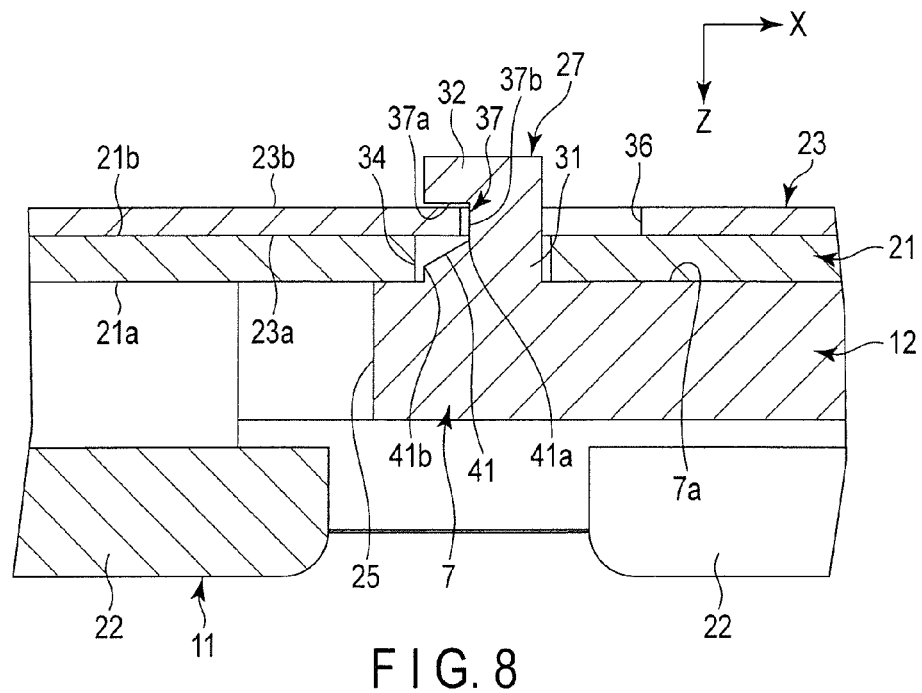
FIG. 8 is an exemplary cross-sectional view taken along line F8-F8, of the engagement portion illustrated in FIG. 7.

As illustrated in FIGS. 6 to 8, an example of the engagement portion 27 is a projection that includes a first portion 31 (i.e., a first engagement portion, a supporting portion, or a positioning portion) and a second portion 32 (i.e., a second engagement portion, an engagement portion, or a fixing portion). The first portion 31 and the second portion 32 are arranged each other in the projecting direction (i.e., the thickness direction of the housing 5) of the engagement portion 27. The first portion 31 constitutes a proximal end of the projection and is connected (i.e., adjacent) to the inner surface 7a of the housing 5. The second portion 32 constitutes a distal end of the projection and projects toward the inner side of the housing 5. That is, the second portion 32 is provided at the distal end of the first portion 31. In other words, the first portion 31 is positioned between the inner surface 7a of the housing 5 and the second portion 32.

As illustrated in FIGS. 6 to 8, the first portion 31 has a cylindrical shape, for example. The first portion 31 is a portion that positions the keyboard 11 (e.g., the keyboard base 21). The first portion 31 has substantially the same thickness as that of the keyboard base 21, for example.

The second portion 32 is a portion that projects further from the first portion 31. The second portion 32 is a portion that is attached and fixed to the support plate 23 described below. The second portion 32 has a cylindrical shape that is continuous to the first portion 31, for example. The outer shape of the second portion 32 is substantially the same as the outer shape of the first portion 31, for example, or is smaller than the outer shape of the first portion 31.

As illustrated in FIGS. 4 and 5, the keyboard base 21 includes a plurality of second openings 34 which are formed at the positions corresponding to the respective engagement portions 27. The second opening 34 has an opening shape corresponding to the outer shape of the first portion 31 of the engagement portion 27, for example. The second opening 34 is a circular hole through which the first portion 31 passes.

Here, a first direction X, a second direction Y, and a third direction Z are defined. The first direction X and the second direction Y extend along the inner surface 7a of the housing 5. The first direction X is a front-rear direction of the housing 5 and is a lateral direction of the housing 5, for example.

The second direction Y is a direction crossing (e.g., substantially orthogonal to) the first direction X. The second direction Y is a left-right direction of the housing 5 and is a longitudinal direction of the housing 5, for example. The third direction Z is a direction crossing (e.g., substantially orthogonal to) the first direction X and the second direction Y. The third direction Z is a direction extending from the lower wall 8 to the upper wall 7 and is the thickness direction of the housing 5.

As illustrated in FIGS. 4 and 5, the keyboard 11 is placed on the inner surface 7a of the housing 5 from the third direction Z. The first portion 31 and the second portion 32 of the engagement portion 27 pass through the second opening 34. In this way, the keyboard 11 makes contact with the inner surface 7a of the housing 5. The keyboard 11 (e.g., the keyboard base 21) is positioned by the first portion 31 when the first portion 31 of the engagement portion 27 passes through the second opening 34. That is, the position of the keyboard 11 is regulated by the first portion 31 of the engagement portion 27, and the movement in the first direction X and the second direction Y is regulated.

Specifically, the second openings 34 include two first holes 34a and a plurality of second holes 34b, for example. The second holes 34b correspond to all of the remaining holes of the respective second openings 34, which do not correspond to the first holes 34a, for example. The second hole 34b is relatively large in relation to the outer shape of the engagement portion 27. That is, a gap (e.g., a backlash) is provided between the second hole 34b and the engagement portion 27. In this way, the second hole 34b can be offset to some extent in relation to the engagement portion 27.

On the other hand, the first hole 34a is a positioning opening. The first gap between the first hole 34a and the engagement portion 27 which is inserted in the first hole 34a is smaller than the second gap between the second hole 34b and the engagement portion 27 which is inserted in the second hole 34b. The keyboard 11 is positioned when the first hole 34a engages with the engagement portion 27. For example, the two first hole 34a are positioned to be separated at both ends of the keyboard 11.

In the present embodiment, the keyboard 11 has a rectangular shape that includes four corners. The two first holes 34a are positioned to be separated at two corners which are the opposing corners of the keyboard 11. The number of second holes 34b is not limited to 2 and may be 3 or more. Moreover, the second holes 34b may not be disposed to be separated at both ends of the keyboard 11.

Next, the support plate 23 (i.e., a reinforcing portion, a reinforcing plate, a metal plate, a metal portion, a supporter, a holder, a metal sheet, a plate portion, or a plate) will be described. The support plate 23 is an example of a "member (i.e., component)."

The support plate 23 is a metallic plate member, for example. The support plate 23 has higher rigidity than the keyboard 11. The support plate 23 faces the second surface 21b of the keyboard base 21. The support plate 23 faces the keyboard 11 from a side opposite to the inner surface 7a (e.g., the first opening 25) of the housing 5.

The support plate 23 is substantially the same as the outer shape of the keyboard 11 or is further larger than the outer shape of the keyboard 11. The support plate 23 covers the entire keyboard 11, for example. The support plate 23 makes contact with the keyboard 11 from a side opposite to the inner surface 7a (e.g., the first opening 25) of the housing 5 and supports the keyboard 11. The support plate 23 presses the keyboard 11 toward the inner surface 7a of the housing 5.

As illustrated in FIGS. 4 and 5, the support plate 23 includes a plurality of third openings 36 at positions corresponding to the respective engagement portions 27. The third opening 36 has an opening shape such that the second portion 32 of the engagement portion 27 can be inserted into the third opening 36. An example of the third opening 36 is a long hole that extends in the first direction X. As illustrated in FIGS. 6 and 7, the third opening 36 overlaps the second opening 34 and communicates with the second opening 34. The second portion 32 of the engagement portion 27 passes through the third opening 36.

As illustrated in FIGS. 4 and 5, the support plate 23 is placed on the second surface 21b of the keyboard base 21 from the third direction Z. The second portion 32 of the engagement portion 27 passes through the third opening 36. In this way, the support plate 23 makes contact with the second surface 21b of the keyboard base 21.

The support plate 23 is slid substantially in parallel with the inner surface 7a of the housing 5 in a state where the keyboard 11 is positioned by the first portion 31 of the engagement portion 27, the second portion 32 of the engagement portion 27 passes through the third opening 36, and the support plate 23 makes contact with the keyboard 11.

Specifically, the support plate 23 is slid in the first direction X in a state where the support plate 23 is placed on the second surface 21b of the keyboard base 21. In this way, the edge of the third opening 36 engages with the second portion 32 of the engagement portion 27. As a result, the support plate 23 is engaged with the second portion 32 of the engagement portion 27 and is supported by the engagement portion 27. Therefore, the support plate 23 supports the keyboard 11 from a side opposite to the inner surface 7a (e.g., the first opening 25) of the housing 5.

More specifically, as illustrated in FIGS. 6 to 8, the second portion 32 of the engagement portion 27 is a hook, and a receiver 37 (i.e., a groove, an attachment portion, or a fitting portion) is formed in the engagement portion 27. The receiver 37 is a groove that extends substantially in parallel with the inner surface 7a of the housing 5, for example. The receiver 37 faces the edge (i.e., inner surface) of the third opening 36 of the support plate 23 from a direction opposite to the first direction X. The support plate 23 that is slid in the first direction X is inserted into the receiver 37. And the receiver 37 receives the support plate 23.

Specifically, as illustrated in FIG. 8, the support plate 23 includes a first surface 23a and a second surface 23b. The first surface 23a faces the keyboard 11. The second surface 23b is positioned on a side opposite to the first surface 23a and is exposed to the inside of the housing 5.

On the other hand, the receiver 37 includes a first surface 37a and a second surface 37b. The first surface 37a faces the support plate 23 from a side opposite to the inner surface 7a (e.g., the first opening 25) of the housing 5. That is, the first surface 37a of the receiver 37 faces the second surface 23b of the support plate 23. The first surface 37a of the receiver 37 makes contact with the second surface 23b of the support plate 23 and supports the second surface 23b.

The second surface 37b of the receiver 37 extends in a direction crossing (e.g., substantially orthogonal to) the first surface 37a. The second surface 37b extends in the thickness direction of the housing 5, for example. The second surface 37b faces the support plate 23 from a direction opposite to the first direction X. The second surface 37b faces the inner circumferential surface of the third opening 36. The second surface 37b regulates the movement of the support plate 23 in the first direction X. The edge of the third opening 36 includes a linear portion 36a that extends substantially in parallel with the second surface 37b. The linear portion 36a makes contact with the second surface 37b, whereby the movement of the support plate 23 is regulated.

As illustrated in FIG. 8, the first portion 31 of the engagement portion 27 includes a slope portion 41 (e.g., a sloped surface). The slope portion 41 is formed at the boundary between the first portion 31 and the second portion 32. The slope portion 41 is inclined away from the second surface 21b of the keyboard base 21 so that the edge of the third opening 36 does not make contact with the first portion 31.

Specifically, the slope portion 41 includes a first end portion 41a and a second end portion 41b. The first end portion 41a is connected to the end of the second surface 37b of the second portion 32. The second end portion 41b is positioned on a side opposite to the first end portion 41a. The second end portion 41b is positioned closer to the inner surface 7a of the housing 5 as compared to the first end portion 41a.

That is, the slope portion 41 is inclined away from the support plate 23 as the slope portion 41 advances from the first end portion 41a to the second end portion 41b. The second end portion 41b is positioned on the inner side of the second opening 34 of the keyboard 11. The second end portion 41b is positioned closer to the inner surface 7a of the housing 5 than the second surface 21b of the keyboard base 21. Thus, the support plate 23 is hardly caught on the first portion 31 of the slope portion 41 when the support plate 23 is slid. Therefore, the support plate 23 moves smoothly toward the inner side of the receiver 37.

As illustrated in FIGS. 4 and 5, the support plate 23 includes a plurality of cutouts 43 at positions corresponding to several engagement portions 27. The support plate 23 is slid in the first direction X in a state where the support plate 23 is placed on the second surface 21b of the keyboard base 21. In this way, similarly to the edge of the third opening 36, the edge of the cutout 43 engages with the receiver 37 of the second portion 32 of the engagement portion 27. As a result, the support plate 23 is fixed to the second portion 32 of the engagement portion 27 and is supported by the engagement portion 27.

Figure 9:
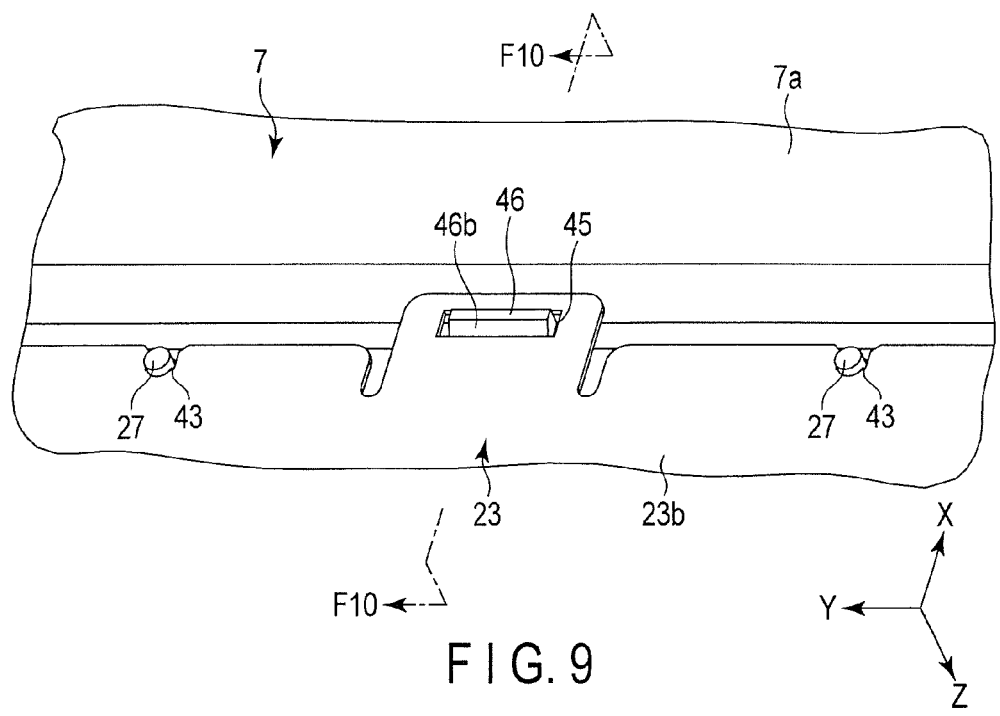
FIG. 9 is an exemplary perspective view illustrating part of the support plate illustrated in FIG. 5 in an enlarged scale.

As illustrated in FIG. 4, a plurality of fourth openings 45 is formed in the end portion of the support plate 23. As illustrated in FIGS. 9 and 10, a plurality of supporters 46 (i.e., second engagement portions, fixing portions, attachment portions, removal preventing portions, or claws) are provided on the inner surface 7a of the housing 5 at positions corresponding to the respective fourth openings 45. The fourth opening 45 has an opening shape such that the supporter 46 can be inserted into the fourth opening 45.

As illustrated in FIG. 10, the supporter 46 is a projection that projects from the inner surface 7a of the housing 5 toward the inner side of the housing 5. The supporter 46 includes a first surface 46a, a second surface 46b, and a third surface 46c. The first surface 46a extends in the thickness direction of the housing 5. The first surface 46a faces the inner circumferential surface of the fourth opening 45 in the first direction X. The first surface 46a is a latching surface (i.e., a position regulating surface). The first surface 46a makes contact with the inner surface of the fourth opening 45 and regulates the movement of the support plate 23 in the direction opposite to the first direction X.

The second surface 46b is positioned on a side opposite to the first surface 46a. The second surface 46b faces the support plate 23 from a direction opposite to the first direction X. The second surface 46b is a slope portion (e.g., a sloped surface). The third surface 46c extends between the first surface 46a and the second surface 46b.

The second surface 46b is inclined away from the second surface 21b of the keyboard base 21. Specifically, the second surface 46b includes a first end portion 46ba and a second end portion 46bb. The first end portion 46ba is connected to an end of the third surface 46c. The second end portion 46bb is positioned on a side opposite to the first end portion 46ba. The second end portion 46bb is positioned closer to the inner surface 7a of the housing 5 as compared to the first end portion 46ba.

That is, the second surface 46b is inclined away from the support plate 23 as the second surface 46b advances from the first end portion 46ba to the second end portion 46bb. The second end portion 46bb is positioned on the inner side of the fourth opening 45 of the keyboard 11. The second end portion 46bb is positioned closer to the inner surface 7a of the housing 5 than the second surface 21b of the keyboard base 21. Thus, the support plate 23 makes contact with the second surface 46b of the supporter 46 when the support plate 23 is slid. The edge of the fourth opening 45 is guided to the second surface 46b to climb over the supporter 46. In this way, the supporter 46 is inserted into the fourth opening 45, and the supporter 46 engages with the fourth opening 45. As a result, the movement of the support plate 23 to a direction opposite to the first direction X is regulated.

Next, a method of fixing the keyboard 11 will be described.

As illustrated in FIG. 4, first, the keyboard 11 is placed on the inner surface 7a of the upper wall 7. Specifically, the first portion 31 and the second portion 32 of the engagement portion 27 pass through the second opening 34 of the keyboard base 21. In this way, the keyboard 11 is positioned by the first portion 31 of the engagement portion 27.

Subsequently, the support plate 23 is placed on the second surface 21b of the keyboard 11. Specifically, the second portion 32 of the engagement portion 27 passes through the third opening 36 of the support plate 23. In this way, the support plate 23 makes contact with the second surface 21b of the keyboard 11.

Subsequently, the keyboard 11 is positioned by the first portion 31 of the engagement portion 27, and the support plate 23 is slid in the first direction X in a state where the support plate 23 is in contact with the keyboard 11. At this time, since the keyboard 11 is positioned by the first portion 31 of the engagement portion 27, the keyboard 11 is not moved toward the support plate 23.

The slid support plate 23 engages with the second portion 32 of the engagement portion 27 and is supported on a side opposite to the inner surface 7a of the housing 5. In this way, the support plate 23 supports the keyboard 11 from a side opposite to the inner surface 7a of the housing 5.

The fourth opening 45 of the slid support plate 23 engages with the supporter 46. In this way, the movement of the support plate 23 in a direction opposite to the first direction X is regulated, whereby the support plate 23 is not removed from the engagement portion 27. In this manner, the keyboard 11 and the support plate 23 are attached. That is, in the present embodiment, it is possible to attach the keyboard 11 with one metal sheet member. In the present embodiment, a fixing member such as a screw is not used in attaching the keyboard 11 and the support plate 23.

On the other hand, when the keyboard 11 and the support plate 23 are disassembled, the end portion of the support plate 23 is raised slightly so that the fourth opening 45 is removed from the supporter 46, and the support plate 23 is slid in a direction opposite to the first direction X. In this way, it is possible to disassemble the keyboard 11 and the support plate 23 from the housing 5. In the present embodiment, no tools are required for disassembling the keyboard 11 and the support plate 23.

According to such a configuration, it is possible to reduce the cost of the electronic apparatus 1.

For comparison, FIGS. 11 and 12 illustrate an example of an electronic apparatus. In this electronic apparatus, a keyboard unit has a configuration in which a keyboard base, a plurality of keys, and a metal plate that reinforces the keyboard unit are integrated. The keyboard unit is fixed to the inner surface of a housing by a plurality of screws. Thus, the number of components increases, and an operation of fixing a number of screws in an assembling step is required. These make it difficult to reduce the cost of the electronic apparatus.

On the other hand, in the present embodiment, the electronic apparatus 1 includes the engagement portion 27 that is provided on the inner surface 7a of the housing 5 and the support plate 23 that is slid substantially in parallel with the inner surface 7a of the housing 5 and is configured to engage with the engagement portion 27 and supports the keyboard 11 from a side opposite to the inner surface 7a of the housing 5. According to such a configuration, it is possible to fix the keyboard 11 by sliding the support plate 23 so as to engage with the engagement portion 27.

Thus, it is possible to decrease the number of fixing members such as a screw, for example. In this way, it is possible to decrease the number of components and simplify an assembling step. As a result, it is possible to reduce the cost of the electronic apparatus 1.

In the present embodiment, the engagement portion 27 includes the first portion 31 and the second portion 32. The keyboard 11 engages with the first portion 31, whereby the keyboard 11 is positioned. The support plate 23 is slid substantially in parallel with the inner surface 7a of the housing 5 to engage with the second portion 32 and support the keyboard 11 in a state where the keyboard 11 is positioned by the first portion 31. According to such a configuration, since the position of the keyboard 11 is stabilized by the engagement portion 27, it is not necessary to support the position of the keyboard 11 with another member. Therefore, it is possible to further reduce the cost of the electronic apparatus 1.

In the present embodiment, the housing 5 includes the plurality of first openings 25. The keyboard 11 includes the plurality of keys 22 which are exposed through the respective first openings 25. According to such a configuration, it is possible to decrease the number of fixing members of a tile keyboard. In this way, it is possible to reduce the cost of the electronic apparatus 1.

In the present embodiment, the engagement portion 27 is provided with the receiver 37 that receives the support plate 23. The receiver 37 includes the surface 37a that supports the keyboard 11 from a side opposite to the inner surface 7a of the housing 5. According to such a configuration, it is possible to stably support the keyboard 11 even when the number of fixing members is decreased.

In the present embodiment, the size of the support plate 23 is substantially the same as that of the keyboard 11 or is greater than that of the keyboard 11. The support plate 23 covers the entire lower surface of the keyboard 11. Thus, the keyboard 11 is supported by the support plate 23 more stably.

In the present embodiment, the first portion 31 of the engagement portion 27 is positioned between the inner surface 7a of the housing 5 and the second portion 32 of the engagement portion 27. According to such a configuration, it is possible to decrease the space required for providing the engagement portion 27 as compared to a case where the first portion 31 and the second portion 32 are arranged separately. This contributes to reducing the size and the packaging density of the electronic apparatus 1.

According to the above configuration, it is possible to position the keyboard 11 using the second opening 34 of the keyboard 11 through which the second portion 32 of the engagement portion 27 passes. In this way, it is possible to further simplify the configuration of the keyboard 11 or the housing 5. This contributes to reducing the cost of the electronic apparatus 1.

In the present embodiment, the supporter 46 is provided so that the slid support plate 23 engages with the supporter 46, and the movement of the support plate 23 in a direction opposite to the sliding direction of the support plate 23 is regulated. According to such a configuration, it is possible to stably support the slid support plate 23.

In the present embodiment, the housing 5 includes the closed portions 26 between the respective first openings 25. At least one of the respective engagement portions 27 is provided on the closed portion 26. According to such a configuration, it is possible to support the central region of the keyboard 11 as well as the end portion of the keyboard 11. Thus, it is possible to support the keyboard 11 more stably.

In the present embodiment, the first portion 31 has a cylindrical shape. The second opening 34 is a circular hole through which the first portion 31 passes. According to such a configuration, stress is hardly concentrated on a specific position of the second opening 34. Thus, it is possible to support the keyboard 11 more stably.

In the present embodiment, the third opening 36 of the support plate 23 is a long hole that extends in the sliding direction of the support plate 23. According to such a configuration, it is possible to allow the third opening 36 to reliably engage with the engagement portion 27 with a relatively simple configuration.

In the present embodiment, the first portion 31 of the engagement portion 27 includes the slope portion 41 that is inclined away from the second surface 21b of the keyboard base 21 so that the edge of the third opening 36 does not make contact with the first portion 31. According to such a configuration, the slid support plate 23 is hardly caught on the first portion 31, and the movement of the support plate 23 is stabilized.

In the present embodiment, the second openings 34 of the keyboard 11 include two first holes 34a and a plurality of second holes 34b. The gap between the first hole 34a and the first portion 31 inserted in the first hole 34a is smaller than the gap between the second hole 34b and the first portion 31 inserted in the second hole 34b. According to such a configuration, it is possible to position the keyboard 11 using the two first positioning holes 34a with high accuracy. Further, in the present embodiment, the two first holes 34a are positioned to be separated at both ends of the keyboard base 21. According to such a configuration, it is possible to position the keyboard 11 with higher accuracy.

Second Embodiment

Next, an electronic apparatus 1 according to a second embodiment will be described with reference to FIG. 13. In the second embodiment, components having the same or similar functions as those in the first embodiment are denoted by the same reference numerals and a description thereof will not be repeated. In addition, configurations other than the following configurations are the same as those in the first embodiment.

In the present embodiment, a plurality of engagement portions 27 is provided on the inner surface 7a of the housing 5. The engagement portion 27 is separated from the keyboard attachment region 28 and is provided on the outer side of the keyboard 28 (e.g., around the keyboard). In the present embodiment, the keyboard 11 is not provided with the second opening 34.

The engagement portion 27 includes a first portion 31 and a second portion 32. In the present embodiment, the first portion 31 and the second portion 32 are positioned to be separated from each other. The first portion 31 and the second portion 32 are provided around the keyboard attachment region 28. The first portion 31 makes contact with an end portion of the keyboard 11, for example. The keyboard 11 is positioned by the first portion 31. The first portion 31 has substantially the same thickness as the keyboard base 21 or has a smaller thickness than the keyboard base 21.

In the present embodiment, the support plate 23 is formed to be further larger than the keyboard 11 and the keyboard attachment region 28. The support plate 23 includes a first region 51 (i.e., a first portion) that faces the keyboard 11 and a second region 52 (i.e., a second portion) that is separated from the keyboard 11.

A second opening 36 is formed in the second region 52 of the keyboard 11. The second opening 36 corresponds to the third opening 36 of the first embodiment. The second opening 36 has an opening shape such that the second portion 32 of the engagement portion 27 can be inserted into the second opening 36. An example of the second opening 36 is a long hole that extends in the first direction X.

The support plate 23 is placed on the second surface 21b of the keyboard 11 from the third direction Z. The second portion 32 of the engagement portion 27 passes through the second opening 36. In this way, the support plate 23 makes contact with the second surface 21b of the keyboard 11. The support plate 23 is slid substantially in parallel with the inner surface 7a of the housing 5 in a state where the keyboard 11 is positioned by the first portion 31, the engagement portion 27 passes through the second opening 36, and the support plate 23 makes contact with the keyboard 11. In this way, the edge of the second opening 36 engages with the receiver 37 of the engagement portion 27. As a result, the support plate 23 is fixed to the engagement portion 27 and is supported by the engagement portion 27.

According to such a configuration, similarly to the first embodiment, it is possible to reduce the cost of the electronic apparatus 1.

Third Embodiment

Next, an electronic apparatus 1 according to a third embodiment will be described with reference to FIG. 14. In the third embodiment, components having the same or similar functions as those in the first and second embodiments are denoted by the same reference numerals and a description thereof will not be repeated. In addition, configurations other than the following configurations are the same as those in the first embodiment.

In the present embodiment, the keyboard attachment region 28 is configured to be removed from other portions of the housing 5. That is, the first cover 12 includes a first member 55 and a second member 56. The first member 55 is a member that is combined with the second cover 13, and includes a part of the upper wall 7 including a palm rest. The second member 56 is attached to the first member 55. The second member 56 includes the keyboard attachment region 28. The second member 56 includes a plurality of first openings 25 and closed portions 26.

In the present embodiment, a plurality of engagement portions 27 is provided on the inner surface 7a of the housing 5. The engagement portion 27 is separated from the keyboard attachment region 28 and is provided on the outer side of the keyboard 28 (e.g., around the keyboard). In the present embodiment, the keyboard 11 is not provided with the second opening 34. Moreover, in the present embodiment, the engagement portion 27 does not have the first portion 31.

In the present embodiment, the support plate 23 is formed to be further larger than the keyboard 11 and the keyboard attachment region 28. The keyboard 11 is attached to the support plate 23 and is integrated with the support plate 23. The keyboard 11 is attached to the support plate 23 by an adhesive member such as, for example, an adhesive agent or a double-side adhesive tape. The support plate 23 includes a first region 51 (i.e., a first portion) that faces the keyboard 11 and a second region 52 (i.e., a second portion) that is separated from the keyboard 11.

A second opening 36 is formed in the second region 52 of the keyboard 11. The second opening 36 corresponds to the third opening 36 of the first embodiment. The second opening 36 has an opening shape such that the engagement portion 27 can be inserted into the second opening 36. An example of the second opening 36 is a long hole that extends in the first direction X.

The support plate 23 is placed on the second surface 21b of the keyboard 11 from the third direction Z. The engagement portion 27 passes through the second opening 36. The support plate 23 is slid substantially in parallel with the inner surface 7a of the housing 5. In the present embodiment, the keyboard 11 is slid with the movement of the support plate 23. The second member 56 is attached to the first member 55 after the keyboard 11 is slid.

According to such a configuration, similarly to the first embodiment, it is possible to reduce the cost of the electronic apparatus 1.

Fourth Embodiment

Next, an electronic apparatus 1 according to a fourth embodiment will be described with reference to FIGS. 15 and 16. In the fourth embodiment, components having the same or similar functions as those in the first to third embodiments are denoted by the same reference numerals and a description thereof will not be repeated. In addition, configurations other than the following configurations are the same as those in the second embodiment.

As illustrated in FIG. 15, the electronic apparatus 1 according to the present embodiment is a slate-type portable computer (a slate PC or a tablet), for example. The electronic apparatus 1 includes a flat box-like housing 5. The housing 5 includes an upper wall 7 (i.e., a first wall), a lower wall 8 (i.e., a bottom wall or a second wall), and a circumferential wall 9 (i.e., a side wall or a third wall). The upper wall 7 has an opening 7b through which the display screen 16a is exposed.

As illustrated in FIG. 16, the housing 5 includes a display device 16 (a display portion, a display, or a display module). In the present embodiment, the display device 16 is an example of a "module." The display device 16 according to the present embodiment is a thin sheet display and has bendability (i.e., flexibility).

In the present embodiment, a plurality of engagement portions 27 is provided on the inner surface 7a of the housing 5. The engagement portions 27 are separated from the opening 7b and provided on the outer side of the opening 7b. The inner surface 7a is an inner surface of a wall on which the opening is formed so that a module, for example, is exposed to the outside through the opening. In the present embodiment, the inner surface 7a is an inner surface of a wall 7 on which the opening 7b is formed so that the display device 16 is exposed to the outside through the opening 7b.

The engagement portion 27 includes a first portion 31 and a second portion 32. In the present embodiment, the first portion 31 and the second portion 32 are positioned to be separated from each other. The first portion 31 and the second portion 32 are provided around the opening 7b. The first portion 31 makes contact with an end portion of the display device 16, for example. The display device 16 is positioned by the first portion 31. The first portion 31 has substantially the same thickness as the display device 16 or has a smaller thickness than the display device 16.

In the present embodiment, the support plate 23 is formed to be further larger than the display device 16. The support plate 23 includes a first region 61 (i.e., a first portion) that faces the display device 16 and a second region 62 (i.e., a second portion) that is separated from the display device 16.

A second opening 36 is formed in the second region 62 of the display device 16. The second opening 36 corresponds to the third opening 36 of the first embodiment. The second opening 36 has an opening shape such that the second portion 32 of the engagement portion 27 can be inserted into the second opening 36. An example of the second opening 36 is a long hole that extends in the first direction X.

The support plate 23 is placed on the second surface 21b of the display device 16 from the third direction Z. The second portion 32 of the engagement portion 27 passes through the second opening 36. In this way, the support plate 23 makes contact with the second surface 21b of the display device 16. The support plate 23 is slid substantially in parallel with the inner surface 7a of the housing 5 in a state where the display device 16 is positioned by the first portion 31, the engagement portion 27 passes through the second opening 36, and the support plate 23 makes contact with the display device 16. In this way, the edge of the second opening 36 engages with the receiver 37 of the engagement portion 27. As a result, the support plate 23 is fixed to the engagement portion 27 and is supported by the engagement portion 27.

According to such a configuration, similarly to the first embodiment, it is possible to reduce the cost of the electronic apparatus 1.

The embodiments are not limited to the embodiments described above and may be realized by modifying constituent elements in the implementing step within a range without departing from the spirit of the invention. Moreover, various embodiments can be made by appropriately combining a plurality of constituent elements disclosed in the embodiments described above. For example, some constituent elements may be removed from all constituent elements disclosed in the embodiments. Furthermore, constituent elements in different embodiments may be combined appropriately.

For example, the shape of the engagement portion 27 is not limited to a cylindrical shape and may be another shape. The engagement portion 27 may have a quadrangular pillar shape or a triangular pillar shape, for example. Moreover, the shape of the second opening 34 or the third opening 36 is not limited to the above embodiments.

For example, the sliding direction of the support plate 23 is not limited to the front-rear direction and may be a left-right direction. The module supported by the support plate 23 is not limited to the keyboard 11 or the display device 16, and may be another module or unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing comprising one or more first openings;
at least one engagement portion that is a projection on an inner surface of the housing, the engagement portion comprising (i) a first portion located in a proximal end portion of the projection, the proximal end portion being coupled to the inner surface of the housing, and (ii) a second portion located in a distal end portion of the projection, the second portion having an outer size substantially equal to or smaller than the first portion when viewed in a direction substantially perpendicular to the inner surface of the housing;
a keyboard comprising (i) a keyboard base positioned in the housing, the keyboard base comprising at least one second opening, and (ii) a plurality of keys positioned on the keyboard base, the plurality of keys being exposed from the first openings respectively, wherein a position of the keyboard is configured to be fixed by insertion of the first portion into the second opening and the keyboard base is in contact with the inner surface of the housing; and
a member configured to support the keyboard from a side opposite to the first openings, wherein the member comprises a third opening and is configured to slide substantially in parallel with the inner surface of the housing so that an edge of the third opening engages the second portion of the engagement portion in a state where the position of the keyboard is fixed by the first portion of the engagement portion, the second portion of the engagement portion passes through the third opening, and the member contacts with the keyboard.

2. The electronic apparatus of claim 1, further comprising a supporter on the inner surface of the housing, the supporter configured to engage the member to regulate a movement of the member in a direction opposite to a sliding direction of the member.

3. The electronic apparatus of claim 1, wherein
the housing comprises a closed portion between the first openings, and
the engagement portion is on the closed portion.

4. The electronic apparatus of claim 1, wherein
the keyboard base comprises a first surface facing the inner surface of the housing and a second surface opposite the first surface, the second surface facing the member, and
the first portion of the engagement portion comprises a slope inclined away from the second surface of the keyboard base to avoid the edge of the third opening contacting the first position of the engagement portion.

5. The electronic apparatus of claim 1, wherein
the first portion of the engagement portion is cylindrical, and the second opening is a circular hole through which the first portion passes.

6. The electronic apparatus of claim 5, wherein
the third opening is a long hole extending in a sliding direction of the member.

7. The electronic apparatus of claim 1, wherein
the second openings comprises first holes and second holes,
a first gap between one of the first holes and the first portion of the engagement portion which is inserted into the one of first holes is smaller than a second gap between one of the second holes and the first portion of the engagement portion which is inserted into the one of the second holes, and
the first holes are positioned to be separated at both ends of the keyboard base.

8. The electronic apparatus of claim 1, wherein the first portion of the at least one engagement portion is physically coupled to the inner surface of the housing.

9. The electronic apparatus of claim 1, wherein the second portion of the at least one engagement portion includes a width that is smaller than or equal to a width of the first portion.

10. The electronic apparatus of claim 1, wherein a diameter of a cross-section of the second portion of the at least one engagement portion is smaller than or equal to a diameter of a cross-section of the first portion of the at least one engagement portion.

11. An electronic apparatus comprising:
a housing that includes an inner surface;
at least one engagement portion that is a projection on the inner surface of the housing, the engagement portion comprising (i) a first portion located in a proximal end portion of the projection, the first portion being coupled to the inner surface of the housing, and (ii) a second portion located in a distal end portion of the projection, the second portion including an outer shape that is substantially equal to or smaller in size than an outer shape of the first portion oriented linear to the second portion;
a keyboard comprising (i) a plurality of keys and (ii) a keyboard base that includes at least one opening, the keyboard configured to be fixed by insertion of the first portion into the opening and placing the keyboard base in contact with the inner surface of the housing; and
a member that is configured to support the keyboard and is oriented substantially in parallel with the inner surface of the housing, wherein the member comprises a second opening through which the second portion of the engagement portion passes and engages with an edge of the second opening when the keyboard is fixed by the first portion of the engagement portion.

* * * * *